United States Patent
Yang et al.

(10) Patent No.: US 11,164,742 B2
(45) Date of Patent: Nov. 2, 2021

(54) SELECTIVE DEPOSITION USING METHYLATION TREATMENT

(71) Applicants: Mattson Technology, Inc., Fremont, CA (US); Beijing E-Town Semiconductor Technology Co., Ltd., Beijing (CN)

(72) Inventors: Michael X. Yang, Palo Alto, CA (US); Hua Chung, Saratoga, CA (US); Xinliang Lu, Fremont, CA (US)

(73) Assignees: Beijing E-Town Semiconductor Technology Co., Ltd., Beijing (CN); Mattson Technology, Inc., Fremont, CA (US)

( * ) Notice: Subject to any disclaimer, the term of this patent is extended or adjusted under 35 U.S.C. 154(b) by 0 days.

(21) Appl. No.: 16/861,900

(22) Filed: Apr. 29, 2020

(65) Prior Publication Data

US 2020/0350161 A1    Nov. 5, 2020

Related U.S. Application Data

(60) Provisional application No. 62/840,686, filed on Apr. 30, 2019.

(51) Int. Cl.
  H01L 21/02    (2006.01)
(52) U.S. Cl.
  CPC .. H01L 21/02315 (2013.01); H01L 21/02178 (2013.01)
(58) Field of Classification Search
  None
  See application file for complete search history.

(56) References Cited

U.S. PATENT DOCUMENTS

| 5,811,022 A | 9/1998 | Savas et al. |
| 6,028,015 A | 2/2000 | Wang |

(Continued)

FOREIGN PATENT DOCUMENTS

| KR | 10-2002-0059880 A | 7/2002 |
| KR | 10-0777043 | 11/2007 |

(Continued)

OTHER PUBLICATIONS

J. Bao et al., Mechanistic Study of Plasma Damage and $CH_4$ Recovery of Low k Dielectric Surface, International Interconnect Technology Conference, IEEE 2007, 147-149.

(Continued)

*Primary Examiner* — Bo B Jang
(74) *Attorney, Agent, or Firm* — Dority & Manning, P.A.

(57) ABSTRACT

Processes for selective deposition of material on a workpiece are provided. In one example, the method includes placing a workpiece on a workpiece support in a processing chamber. The workpiece has a first material and a second material. The second material is different from the first material. The method includes performing an organic radical based surface treatment process on the workpiece to modify an adsorption characteristic of the first material selectively relative to the second material such that the first material has a first adsorption characteristic and the second material has a second adsorption characteristic. The second adsorption characteristic being different from the first adsorption characteristic. The method includes performing a deposition process on the workpiece such that a material is selectively deposited on the first material relative to the second material.

19 Claims, 11 Drawing Sheets

(56) References Cited

U.S. PATENT DOCUMENTS

| | | |
|---|---|---|
| 7,541,200 B1 | 6/2009 | Schravendijk et al. |
| 7,604,708 B2 | 10/2009 | Wood et al. |
| 9,214,319 B2 | 12/2015 | Nagomv et al. |
| 9,837,270 B1 | 12/2017 | Varadarajan et al. |
| 10,269,574 B1 | 4/2019 | Yang et al. |
| 2003/0042465 A1 | 3/2003 | Ko |
| 2003/0134051 A1 | 7/2003 | Jung et al. |
| 2004/0154743 A1 | 8/2004 | Savas |
| 2006/0081273 A1 | 4/2006 | McDermott |
| 2008/0261405 A1 | 10/2008 | Yang |
| 2009/0274610 A1 | 11/2009 | Ghoanneviss et al. |
| 2011/0117751 A1 | 5/2011 | Sonthalia |
| 2011/0244680 A1 | 10/2011 | Tohnoe et al. |
| 2012/0285481 A1 | 11/2012 | Lee et al. |
| 2014/0349480 A1* | 11/2014 | Shek ............ H01L 21/76834 438/652 |
| 2015/0126027 A1 | 5/2015 | Matsumoto |
| 2015/0303065 A1 | 10/2015 | Buckalew |
| 2016/0079062 A1 | 3/2016 | Zheng |
| 2016/0260616 A1 | 9/2016 | Li et al. |
| 2016/0300757 A1 | 10/2016 | Dash et al. |
| 2019/0103270 A1 | 4/2019 | Yang et al. |
| 2019/0103279 A1 | 4/2019 | Yang et al. |

FOREIGN PATENT DOCUMENTS

| | | |
|---|---|---|
| WO | WO 2010-045153 | 4/2010 |
| WO | WO 2017/147365 | 8/2017 |

OTHER PUBLICATIONS

HMDS (available online) Retrieved from the internet May 17, 2018, https://www.microchemicals.com/products/adhesion_promotion/hmds.html—2 pages.

PCT International Search Report and Written Opinion for corresponding PCT Application No. PCT/US2020/030434, dated Aug. 13, 2020, 12 pages.

* cited by examiner

SELECTIVE DEPOSITION USING METHYLATION TREATMENT

PRIORITY CLAIM

The present disclosure claims the benefit of priority of U.S. Provisional Application Ser. No. 62/840,686, titled "Selective Deposition Using Methylation Treatment," filed on Apr. 30, 2019, which is incorporated herein by reference.

FIELD

The present disclosure relates generally to surface treatment of a workpiece, and more particularly to surface treatment of a workpiece to provide for selective deposition.

BACKGROUND

Plasma processing is widely used in the semiconductor industry for deposition, etching, resist removal, and related processing of semiconductor wafers and other substrates. Plasma sources (e.g., microwave, ECR, inductive, etc.) are often used for plasma processing to produce high density plasma and reactive species for processing substrates SUMMARY Aspects and advantages of embodiments of the present disclosure will be set forth in part in the following description, or may be learned from the description, or may be learned through practice of the embodiments.

One example aspect of the present disclosure is directed to a method for processing a workpiece. The method includes placing a workpiece on a workpiece support in a processing chamber. The workpiece has a first material and a second material. The second material is different from the first material. The method includes performing an organic radical based surface treatment process on the workpiece to modify an adsorption characteristic of the first material selectively relative to the second material such that the first material has a first adsorption characteristic and the second material has a second adsorption characteristic. The second adsorption characteristic being different from the first adsorption characteristic. The method includes performing a deposition process on the workpiece such that a material is selectively deposited on the first material relative to the second material.

Other example aspects of the present disclosure are directed to systems, methods, and apparatus for selective deposition of a material on workpieces.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
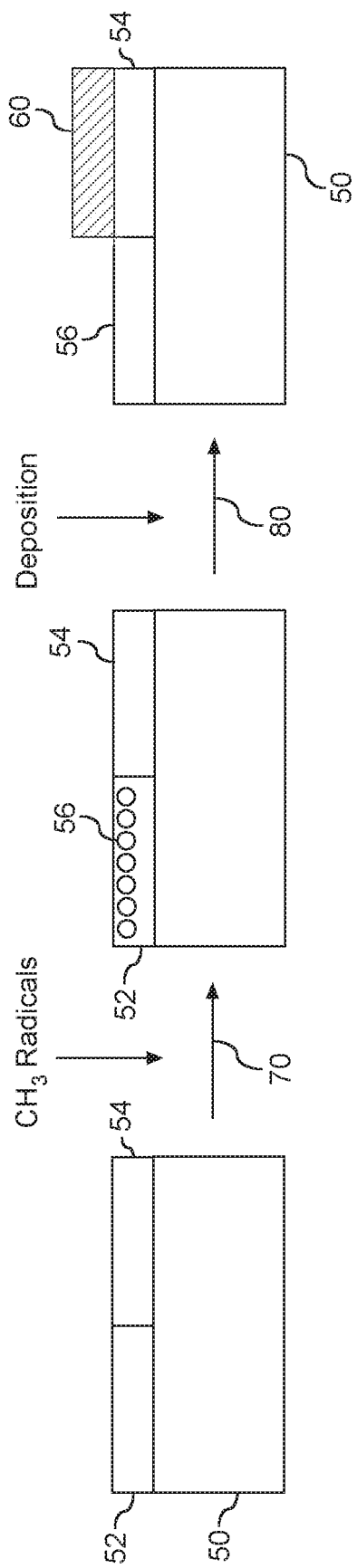
FIG. 1 depicts an example selective deposition process using methylation treatment according to example embodiments of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Example aspects of the present disclosure are directed to selective deposition of materials on a workpiece, such as a semiconductor wafer used in semiconductor device fabrication. More particularly, in some embodiments, a surface treatment process can be used to selectively methylate different materials on the workpiece. The methylated surface can block precursor adsorption for certain materials relative to non-methylated surfaces on the workpiece. In this regard, materials can be selectively deposited on the non-methylated surfaces of the workpiece relative to the methylated surface (e.g., more material is deposited on the non-methylated surface relative to the methylated surface).

With feature size continuing to shrink for semiconductor device manufacturing, selective deposition can be an important process step. Selective deposition can refer to the materials being selectively deposited on certain materials of a workpiece while not being deposited on other materials. Existing selective deposition methods are currently limited.

According to example aspects of the present disclosure, an organic radical based surface treatment process, such as a methylation process, can be used to treat a workpiece. The organic radical based surface treatment process can cause a monolayer of methyl radicals ($CH_3$ radicals) to become bonded with certain surfaces on the workpiece. Some materials on the workpiece are methylated while other materials on the workpiece are not methylated During a deposition process, (e.g., a chemical vapor deposition (CVD) process, atomic layer deposition (ALD) process, or other deposition process), certain precursors will selectively adsorb on the non-methylated surfaces and initiate deposition on the non-methylated surfaces. The same precursors do not adsorb on the methylated surfaces, reducing deposition on the methylated surfaces. Alternatively, certain precursors do not adsorb on the non-methylated surfaces, while the precursors do adsorb on the methylated surfaces. In this regard, deposition can be initiated on the methylated surfaces while reducing deposition on the non-methylated surfaces. In this way, the organic radical based surface treatment process(s) according to example aspects of the present disclosure can be used for selective deposition processes on a workpiece.

One example selective deposition process according to example embodiments of the present disclosure is for deposition of $Al_2O_3$ on a workpiece containing a dielectric material (e.g., $SiO_2$, SiN, low-k dielectric layer) and a metal material (e.g., Cu layer). A methyl radical based surface treatment process can expose the workpiece to methyl radicals (e.g., $CH_3$ radicals). The methyl radical based surface treatment process can result in methylation of the dielectric layer. However, due to the difficulty in creating metal-$CH_3$ bonding (e.g., Cu—$CH_3$ bonding), there is no methylation of the metal layer.

During an $Al_2O_3$ ALD process, the workpiece can be exposed to trimethylaluminum (TMA) and to $H_2O$ molecules. During exposure of the workpiece to the $H_2O$ molecules, the $H_2O$ molecules can adsorb on the non-methylated surfaces of the workpiece, such as the metal layer. However, the monolayer of $CH_3$ on the methylated dielectric layer can repel adsorption of the $H_2O$ molecules.

During exposure of the workpiece to TMA, the TMA will react with the $H_2O$ species on the non-methylated surfaces of the workpiece and generate Al—O containing species. Repeated exposure of the workpiece to TMA and $H_2O$ molecules (e.g., with purging of the processing chamber to remove residue and by-products) can result in an ALD layer of $A_2O_3$ deposited on the non-methylated metal surface.

However, on the methylated dielectric surface, because of the existence of $CH_3$ species, $Al(CH_3)_3$ will not adsorb on the methylated metal surface. During the ALD deposition process, no or very little $Al_2O_3$ is deposited on the methylated dielectric surface. In this regard, an ALD $AL_2O_3$ layer can be selectively deposited on the metal surface (e.g., Cu surface) while not on dielectric surfaces.

In some embodiments, after a number of deposition cycles, the methylation may be gradually depleted on the dielectric surface. In this case, a periodic methyl radical based surface treatment process can be conducted after a number of deposition cycles to maintain the selectivity of the deposition process.

The above $Al_2O_3$ deposition process is provided for purposes of illustration and discussion. Those of ordinary skill in the art, using the disclosures provided herein, will understand that example aspects of the present disclosure can be used to implement other selective deposition processes that involve precursors that selectively adsorb on methylated or non-methylated surfaces. Examples include, for instance, (1) deposition of $SiO_2$ using $H_2O$ as a precursor, $O_2$ as a precursor, and/or $N_2O$ as a precursor; (2) ALD of SiN using $NH_3$ as a precursor; (3) etc.

Aspects of the present disclosure are discussed with reference to a "workpiece" or semiconductor wafer for purposes of illustration and discussion. Those of ordinary skill in the art, using the disclosures provided herein, will understand that the example aspects of the present disclosure can be used in association with any semiconductor substrate or other suitable substrate or workpiece. In addition, the use of the term "about" in conjunction with a numerical value is intended to refer to within ten percent (10%) of the stated numerical value.

FIG. 1 depicts an overview of an example selective deposition process according to example aspects of the present disclosure. The selective deposition process can be implemented on a workpiece 50 (e.g., a semiconductor wafer). The workpiece 50 can have a substrate (e.g., Si and/or SiGe substrate). The workpiece 50 can include a first material layer 52 (e.g., dielectric layer) and a second material layer 54 (e.g., metal layer). An organic radical (e.g., methyl radical) based surface treatment process 70 can expose the workpiece 50 to organic radicals, such as $CH_3$ radicals. This can result in methylation of first material layer 52 to generate a methylated first material layer 56. The methylated first material layer 56 can include a monolayer of methyl radicals. The second material layer 54 is not methylated by the organic radical based surface treatment process 70. Details concerning example organic radical surface treatment processes will be discussed with reference to FIGS. 6-9.

A deposition process 80 can expose the workpiece 50 to one or more precursors to initial deposition of a material on the workpiece 50. According to example aspects of the present disclosure, the methylated first material layer 56 can resist adsorption of the precursors, while the second material layer 56 can have adsorption of the precursors. In this regard, selective deposition of a deposition layer 60 on the second material layer 54 can be implemented such that the deposition layer 60 is not deposited on the first material layer 56.

Figure 2:
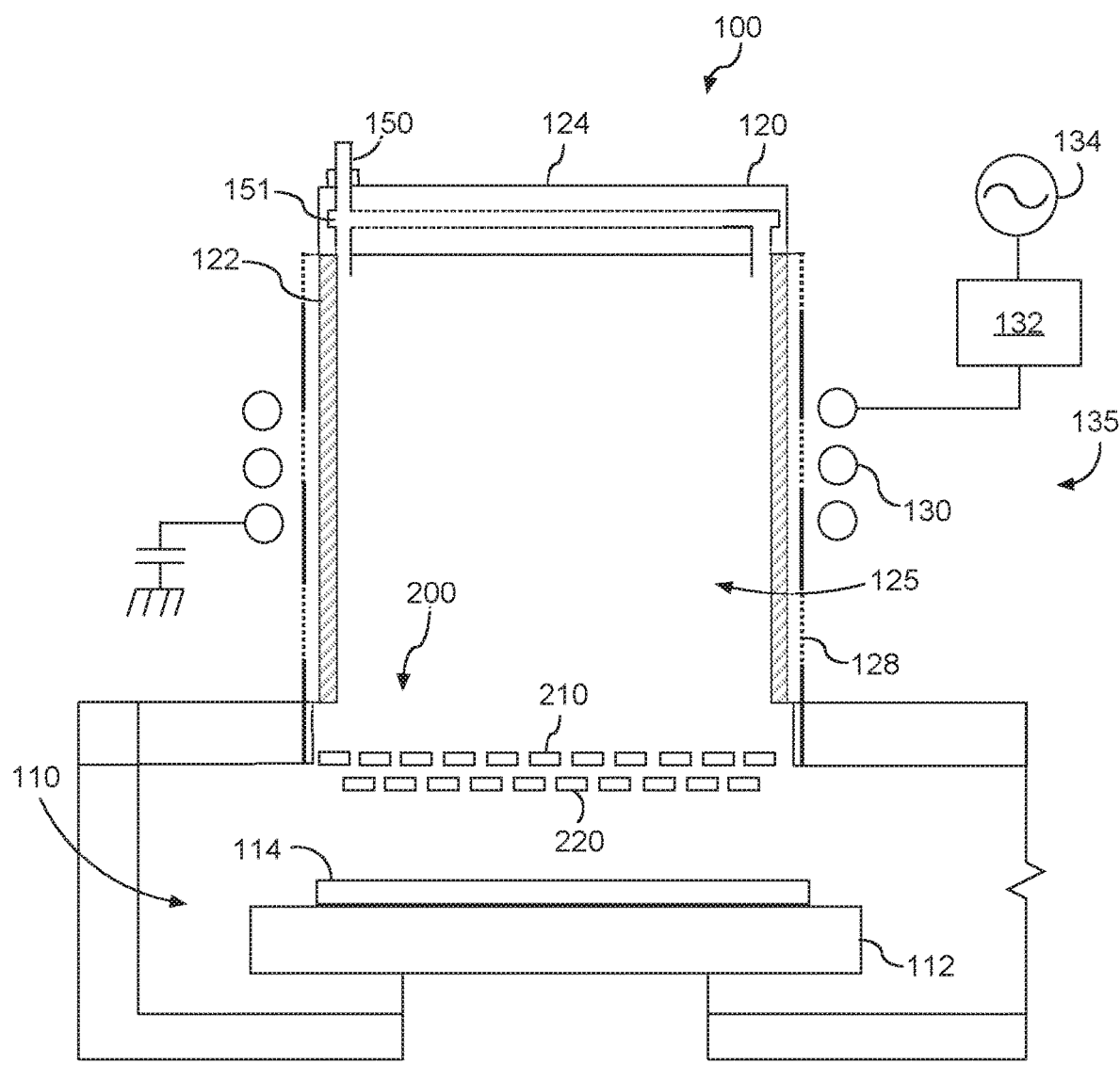
FIG. 2 depicts an example plasma processing apparatus according to example embodiments of the present disclosure.

FIG. 2 depicts an example plasma processing apparatus 100 that can be used to implement aspects of the selective deposition process(s) according to example embodiments of the present disclosure. As illustrated, the plasma processing apparatus 100 includes a processing chamber 110 and a plasma chamber 120 that is separated from the processing chamber 110. The processing chamber 110 includes a substrate holder or pedestal 112 operable to hold a workpiece 114 to be processed, such as a semiconductor wafer. In this example illustration, a plasma is generated in the plasma chamber 120 (i.e., plasma generation region) by an inductively coupled plasma source 135 and desired species are channeled from the plasma chamber 120 to the surface of substrate 114 through a separation grid assembly 200.

Aspects of the present disclosure are discussed with reference to an inductively coupled plasma source for purposes of illustration and discussion. Those of ordinary skill in the art, using the disclosures provided herein, will understand that any plasma source (e.g., inductively coupled plasma source, capacitively coupled plasma source, etc.) can be used without deviating from the scope of the present disclosure.

The plasma chamber 120 includes a dielectric side wall 122 and a ceiling 124. The dielectric side wall 122, the ceiling 124, and the separation grid 200 define a plasma chamber interior 125. The dielectric side wall 122 can be formed from a dielectric material, such as quartz and/or alumina. The inductively coupled plasma source 135 can include an induction coil 130 disposed adjacent the dielectric side wall 122 about the plasma chamber 120. The induction coil 130 is coupled to an RF power generator 134 through a suitable matching network 132. Process gases (e.g., reactant and/or carrier gases) can be provided to the chamber interior from a gas supply 150 and an annular gas distribution channel 151 or other suitable gas introduction mechanism. When the induction coil 130 is energized with RF power from the RF power generator 134, a plasma can be generated in the plasma chamber 120. In a particular embodiment, the plasma processing apparatus 100 can include an optional grounded Faraday shield 128 to reduce capacitive coupling of the induction coil 130 to the plasma.

As shown in FIG. 2, the separation grid 200 separates the plasma chamber 120 from the processing chamber 110. The separation grid 200 can be used to perform ion filtering from a mixture generated by plasma in the plasma chamber 120 to generate a filtered mixture. The filtered mixture can be exposed to the workpiece 114 in the processing chamber 110.

In some embodiments, the separation grid 200 can be a multi-plate separation grid. For instance, the separation grid 200 can include a first grid plate 210 and a second grid plate 220 that are spaced apart in parallel relationship to one another. The first grid plate 210 and the second grid plate 220 can be separated by a distance.

The first grid plate 210 can have a first grid pattern having a plurality of holes. The second grid plate 220 can have a second grid pattern having a plurality of holes. The first grid pattern can be the same as or different from the second grid pattern. Charged particles can recombine on the walls in their path through the holes of each grid plate 210, 220 in the separation grid 200. Neutrals (e.g., radicals) can flow relatively freely through the holes in the first grid plate 210 and the second grid plate 220. The size of the holes and thickness of each grid plate 210 and 220 can affect transparency for both charged and neutral particles.

In some embodiments, the first grid plate 210 can be made of metal (e.g., aluminum) or other electrically conductive material and/or the second grid plate 220 can be made from either an electrically conductive material or dielectric material (e.g., quartz, ceramic, etc.). In some embodiments, the first grid plate 210 and/or the second grid plate 220 can be made of other materials, such as silicon or silicon carbide. In the event a grid plate is made of metal or other electrically conductive material, the grid plate can be grounded.

Figure 3:
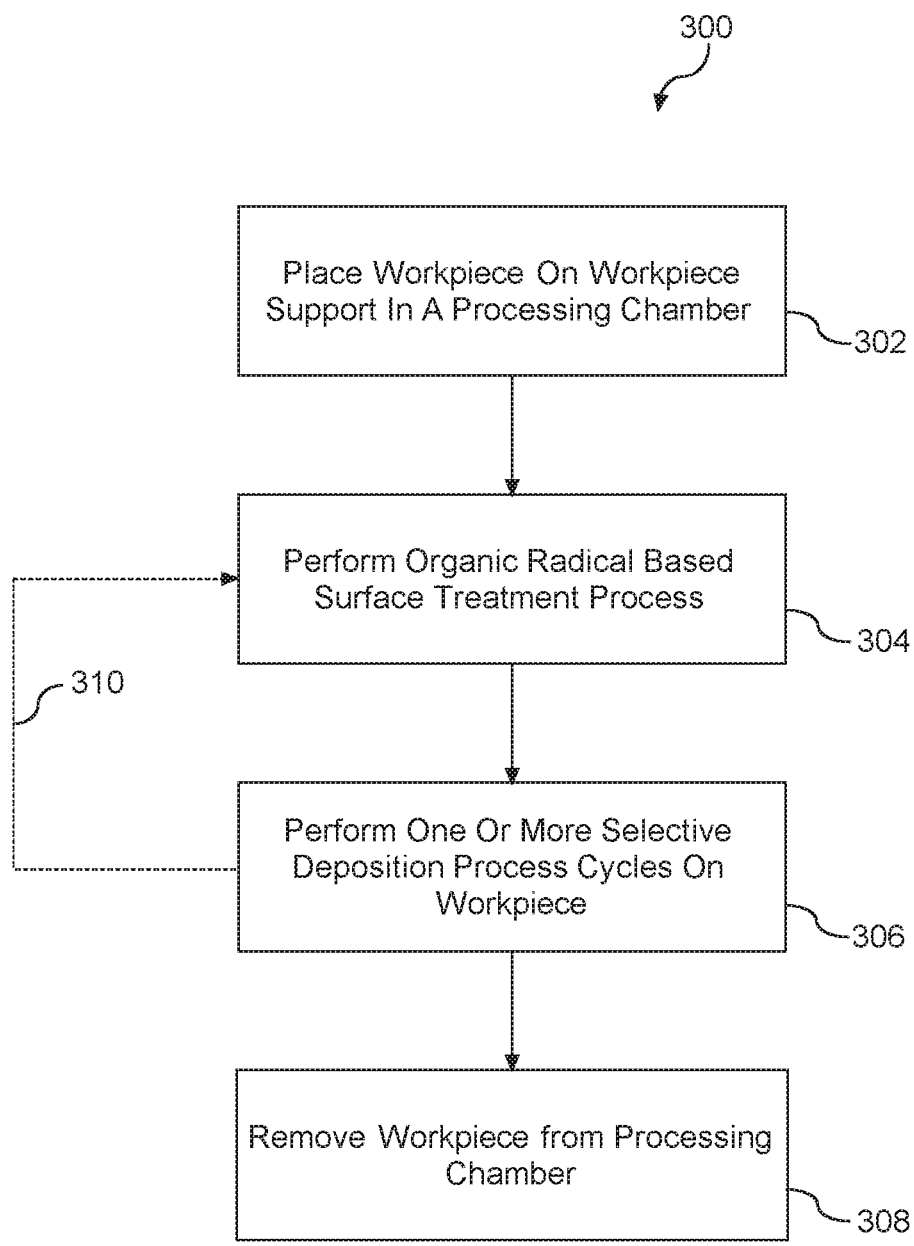
FIG. 3 depicts a flow diagram of an example method according to example embodiments of the present disclosure.

FIG. 3 depicts a flow diagram of an example method (300) for selective deposition of a material on a workpiece according to example aspects of the present disclosure. The method (300) can be implemented using the plasma processing apparatus 100. However, the selective deposition method(s) according to example aspects of the present disclosure can be implemented using other approaches without deviating from the scope of the present disclosure. FIG. 3 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various additional steps (not illustrated) can be performed without deviating from the scope of the present disclosure.

At (302), the method can include placing a workpiece on a workpiece support in a processing chamber. For instance, a workpiece 114 can be placed on pedestal 112 in the processing chamber 110 of plasma processing apparatus 100. The workpiece can include a first material and a second material. For instance, in some embodiments, the first material can be a dielectric layer (e.g., $SiO_2$, SiN, low-k dielectric material, etc.). In some embodiments, the second layer can be a metal layer, such as a copper layer. The selective deposition process can be used to deposit a layer of material on the metal layer as part of, for instance, a back-end-of-line (BEOL) process in semiconductor device manufacturing.

At (304), the method can include performing an organic radical based surface treatment process (e.g., a methyl radical based surface treatment process) on the workpiece to expose the first material layer and the second material layer to one or more organic radicals, such as $CH_3$ radicals. Details concerning an example organic radical based surface treatment process will be discussed in more detail with reference to FIGS. 6-9.

The organic radicals, such as methyl radicals ($CH_3$) radicals can react with the first material layer resulting in methylation of the first material layer (e.g., forming a monolayer of methyl radicals on a surface of the first material layer). The organic radicals do not react with the second material layer, resulting in no methylation of the second material layer.

The methylation of the first material layer relative to the second material layer can selectively modify adsorption characteristics of the first material layer relative to the second material layer. For instance, the adsorption of the first material layer for precursors used in a deposition process can be reduced for the methylated first material layer relative to the second material layer, or vice versa.

At (306), the method can include performing a deposition process (e.g., CVD process, ALD process, etc.) on the workpiece so as to selectively deposit a deposition layer on the second material layer relative to the first material layer. More particularly, the deposition layer is deposited in a greater amount on the second material layer relative to the first material layer, such as at least 5 times greater, such as at least 10 times greater, such as at least 100 times greater. In some embodiments, the deposition process can include one or more cycles. During each cycle, the workpiece is exposed to one or more precursors to initiate the deposition of material on the workpiece. The precursors and any by-products can then be purged from the processing chamber. These deposition cycles can be repeated until a desired amount of deposition material has been deposited on the workpiece.

Figure 4:
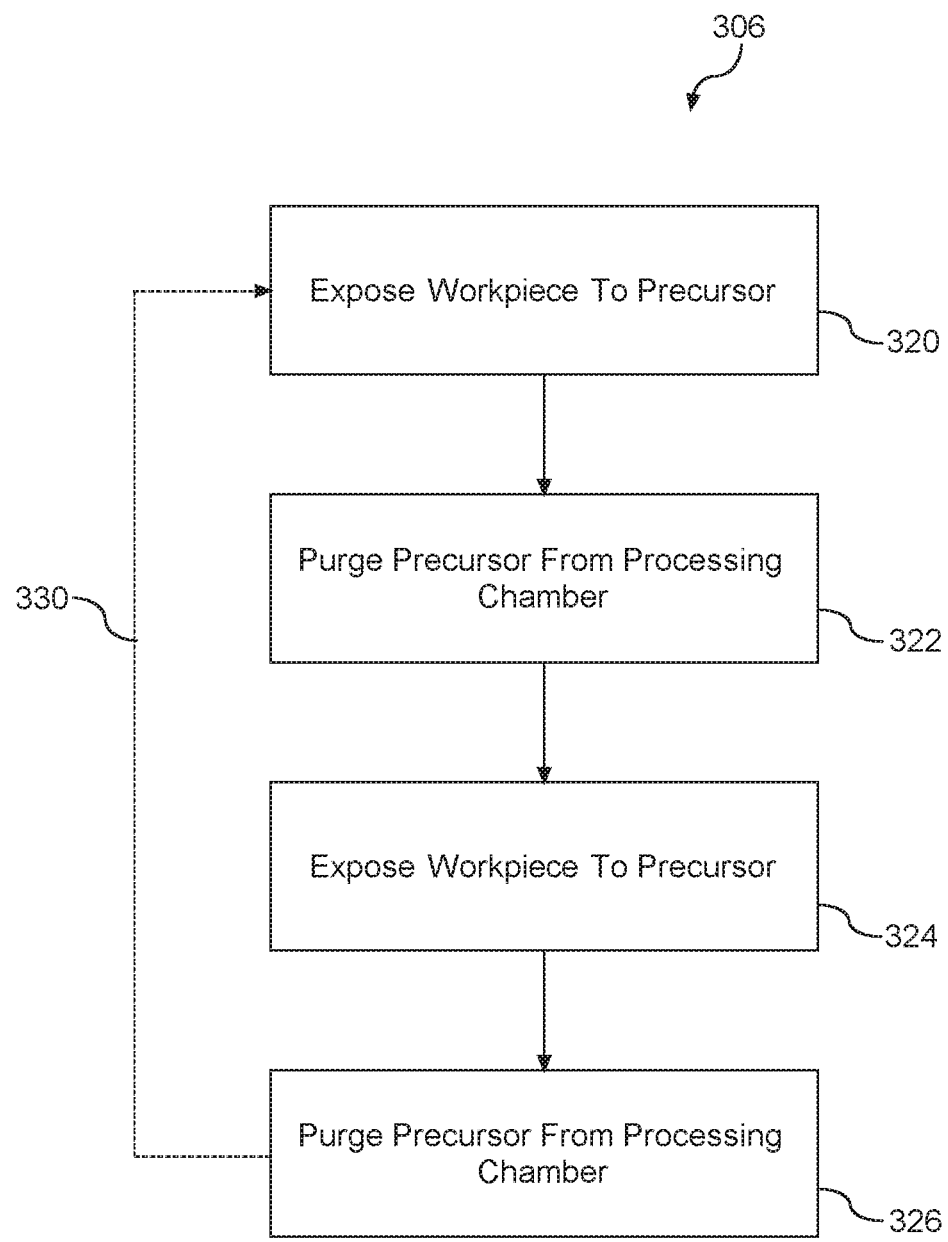
FIG. 4 depicts a flow diagram of an example deposition process according to example embodiments of the present disclosure.

FIG. 4 depicts a flow diagram of an example deposition cycle of a deposition process (306) according to example embodiments of the present disclosure. The method (306) can be implemented using the plasma processing apparatus 100. However, the selective deposition method(s) according to example aspects of the present disclosure can be implemented using other chambers without deviating from the scope of the present disclosure. FIG. 4 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various additional steps (not illustrated) can be performed without deviating from the scope of the present disclosure.

At (320), the method can include exposing the workpiece to a first precursor(s). The first precursor(s) can be selected to initiate deposition of a layer on a portion of the workpiece. For instance, the first precursor(s) can be selected to deposit a deposition layer on the non-methylated material layer of the workpiece. The precursor(s) can generate byproduct from reacting with species on the workpiece.

At (322), the method can include purging the precursor(s) and any byproducts from the process chamber. For instance, a pump can evacuate the precursor(s) from the processing chamber having the workpiece.

At (324), the method can include exposing the workpiece to a second precursor(s). The second precursor(s) can be the same as or different from the first precursor(s). The second precursor(s) can be selected to continue deposition of a layer on a portion of the workpiece. For instance, the second precursor(s) can be selected to deposit a deposition layer on the non-methylated material layer of the workpiece. The precursor(s) can generate byproduct from reacting with species on the workpiece.

At (326), the method can include purging the precursor(s) and any byproducts from the process chamber. For instance, a pump can evacuate the precursor(s) from the processing chamber having the workpiece.

In one example embodiment, the first precursor(s) can include $H_2O$ molecules and TMA molecules. The second precursor(s) can include $H_2O$ molecules and TMA molecules. In some embodiments, the first precursor(s) can include $H_2O$ molecules. The second precursor(s) can include TMA molecules.

As indicated by (330), the deposition process can be repeated for a number of cycles until a desired amount of material has been deposited on the workpiece and/or until a desired number of process cycles have been completed.

Referring back to FIG. 3 at (310), the organic radical based surface treatment process can be performed periodically after one or more cycles of the deposition process to methylate the first material layer relative to the second material layer. At (308), the method includes removing the workpiece from the processing chamber.

Figure 5:
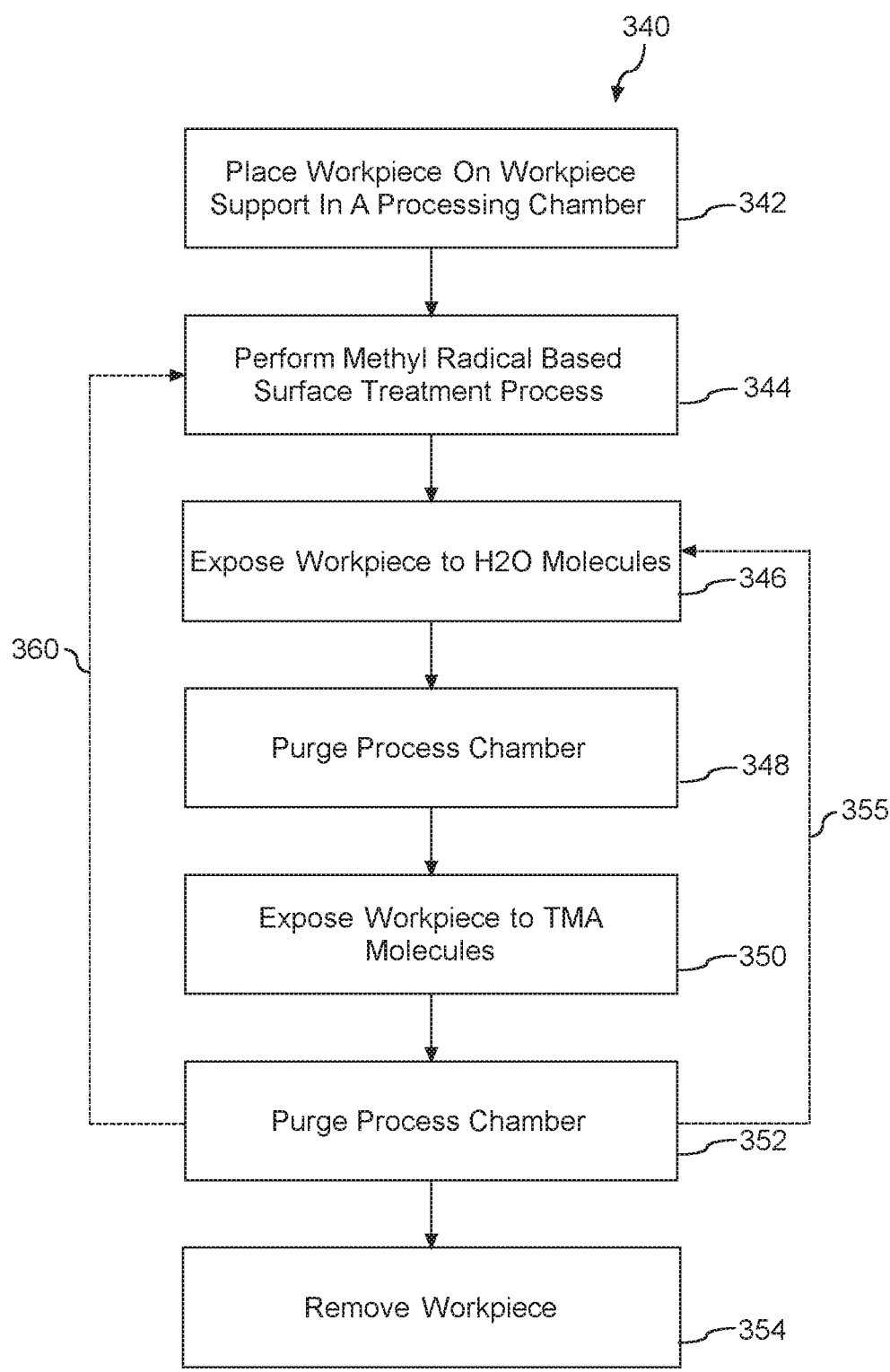
FIG. 5 depicts a flow diagram of an example method according to example embodiments of the present disclosure.

FIG. 5 depicts a flow diagram of one example selective deposition process (340) for ALD of $Al_2O_3$ on a copper layer in a BEOL process for semiconductor device fabrication according to example embodiments of the present disclosure. FIG. 5 is provided for example purposes. Other selective deposition process(s) that involve modifying adsorption properties of a portion of workpiece using organic radical based surface treatment processes fall within the scope of the present disclosure.

At (342), the method can include placing a workpiece on a workpiece support in a processing chamber. For instance, a workpiece 114 can be placed on pedestal 112 in the processing chamber 110 of plasma processing apparatus 100. The workpiece can include a dielectric layer (e.g., $SiO_2$, SiN, low-k dielectric material, etc.) and a copper layer. The selective deposition process can be used to deposit $Al_2O_3$ on the cooper layer as part of, for instance, a back-end-of-line (BEOL) process in semiconductor device manufacturing.

At (344), the method can include performing methyl radical based surface treatment on the workpiece to expose the dielectric layer and the copper layer to one or more $CH_3$ radicals. Details concerning an example organic radical based surface treatment process will be discussed in more detail with reference to FIGS. 6-9.

The $CH_3$ radicals can react with the dielectric layer resulting in methylation of the first material layer (e.g., forming a monolayer of methyl radicals on a surface of the first material layer). The organic radicals do not react with the copper layer, resulting in no methylation of the copper layer.

The methylation of the dielectric layer relative to the copper layer can selectively modify adsorption characteristics of the dielectric layer relative to the copper layer. For instance, the adsorption of the dielectric layer for precursors used in a deposition process can be reduced for the methylated dielectric layer relative to the copper layer.

At (346), the method can include can include exposing the workpiece to a first precursor(s), such as $H_2O$ molecules. The $H_2O$ molecules can adsorb or chemically bond to the copper layer. However, the methylated dielectric layer will repel the $H_2O$ molecules, reducing adsorption of $H_2O$ molecules on the dielectric layer relative to the copper layer.

At (348), the method can include purging the precursor(s) and any byproducts from the process chamber. For instance, a pump can evacuate the precursor(s) from the processing chamber having the workpiece.

At (350), the method can include exposing the workpiece to a second precursor(s), such as TMA molecules. The TMA molecules can react with the adsorbed $H_2O$ molecules on the copper layer and generate Al—O containing species to initiate deposition of an ALD layer of $Al_2O_3$ on the copper layer. The TMA molecules do not react with the methylated surface of the dielectric layer due to reduced adsorption of the $H_2O$ molecules on the dielectric layer.

At (352), the method can include purging the precursor(s) and any byproducts from the process chamber. For instance, a pump can evacuate the precursor(s) from the processing chamber having the workpiece. As shown at (360), the deposition cycles of (346), (348), (350), and (352) can be repeated for a desired number of cycles to selectively deposit an $Al_2O_3$ layer on the copper layer. The workpiece can be removed from the processing chamber at (354).

Figure 6:
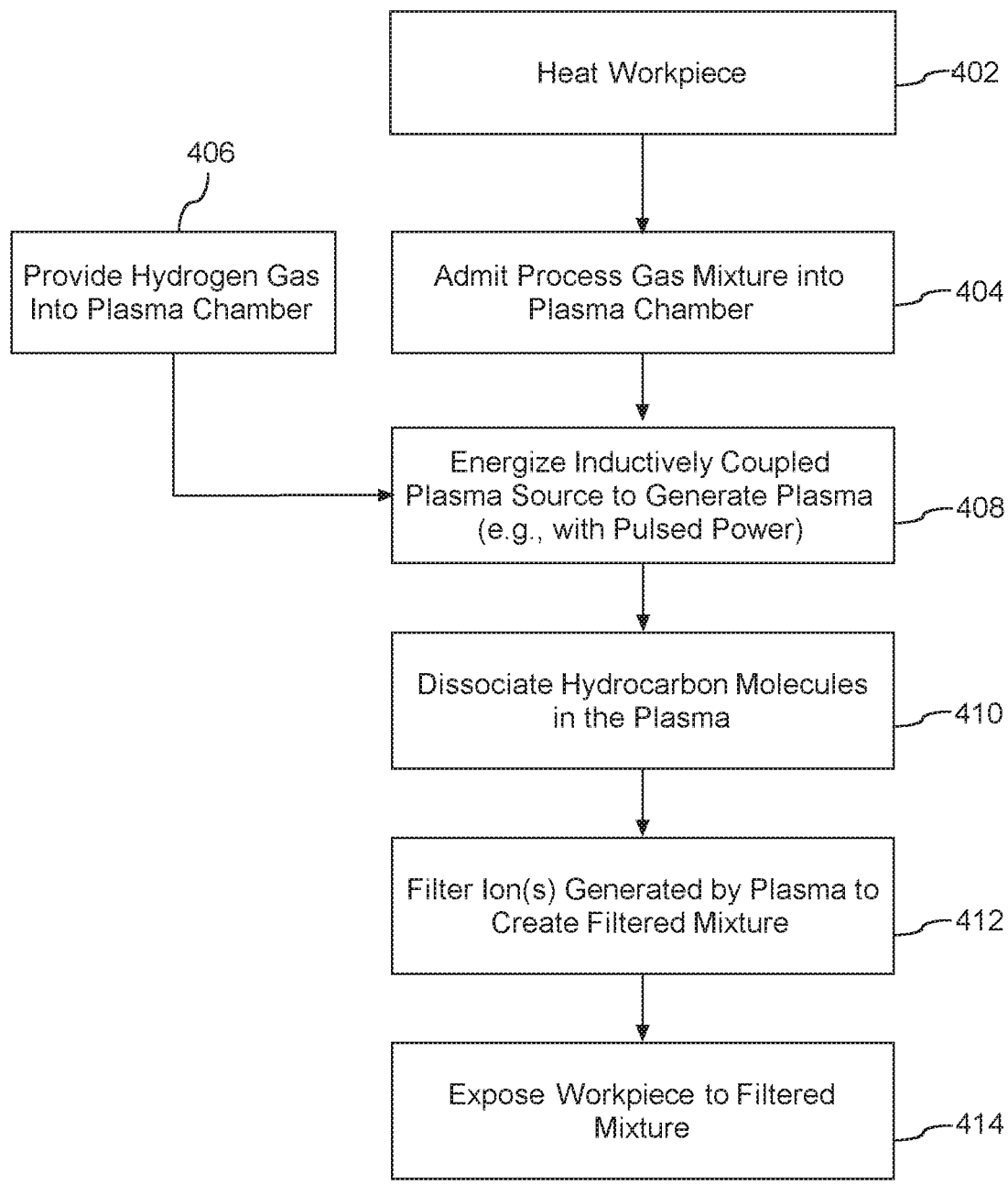
FIG. 6 depicts a flow diagram of an example surface treatment process according to example embodiments of the present disclosure.

FIG. 6 depicts a flow diagram of an example organic radical based surface treatment process (400) according to example aspects of the present disclosure. The organic radical based surface treatment process (400) can be implemented using the plasma processing apparatus 100. However, as will be discussed in detail below, the organic radical based surface treatment processes according to example aspects of the present disclosure can be implemented using other approaches without deviating from the scope of the present disclosure. FIG. 6 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various additional steps (not illustrated) can be performed without deviating from the scope of the present disclosure.

At (402), the organic radical based surface treatment process can include heating a workpiece. For instance, the workpiece 114 can be heated in the processing chamber 110 to a process temperature. The workpiece 114 can be heated, for instance, using one or more heating systems associated with the pedestal 112. In some embodiments, the workpiece can be heated to a process temperature in the range of about 20° C. to about 400° C.

At (404), the surface treatment process can include admitting a process gas into a plasma chamber. For instance, a process gas can be admitted into the plasma chamber interior 125 from the gas source 150 via the annular gas distribution channel 151 or other suitable gas introduction mechanism. In some embodiments, the process gas can include one or more hydrocarbon molecules. Example hydrocarbon molecules can include, for instance, non-cyclic alkanes $C_nH_{2n+2}$ where n is greater than or equal to one and less than or equal to 10. For instance, the hydrocarbon molecules can include non-cyclic alkanes, such as methane $CH_4$, ethane $C_2H_6$, propane or iso-propane $C_3H_8$, etc.

In some embodiments, the hydrocarbon molecules can include cyclic alkanes $C_nH_{2n}$, where n is greater than or equal to five and less than or equal to ten. For instance, the hydrocarbon precursor can include cyclic alkanes such as cyclopentane $C_5H_{10}$, cyclohexane $C_6H_{12}$, methyl-cyclohexane, $C_7H_{14}$, dimethyl-cyclohexane $C_8H_{16}$, 1,3,5-trimethyl-cyclohexane $C_9H_{18}$, etc. In some embodiments, the hydrocarbon precursors can include alkenes $C_nH_{2n}$, where n is greater than or equal to two and less than or equal to ten, such as ethylene $C_2H_4$, propene $C_3H_6$, etc.

At (406), the surface treatment process can include (e.g., optionally include) admitting a second gas into the plasma chamber, such as a reactive gas, such as hydrogen gas ($H_2$). For instance, the second gas can be admitted into the plasma chamber as part of a process gas. The process gas can include a mixture including $H_2$ and $N_2$ and/or a mixture including $H_2$ and He and/or a mixture including $H_2$ and Ar. In some embodiments, the process gas is an inert gas, such as helium, argon, or xenon.

At (408), the surface treatment process can include energizing an inductively coupled plasma source to generate a plasma in the plasma chamber. For instance, the induction coil 130 can be energized with RF energy from the RF power generator 134 to generate a plasma in the plasma chamber interior 125. In some embodiments, the inductively coupled power source can be energized with pulsed power to obtain desired radicals with reduced plasma energy. The plasma can be used to generate one or more hydrogen radicals from the hydrogen gas.

At (410), the surface treatment process can include dissociating one or more hydrocarbon molecules in the mixture in the plasma chamber interior using the plasma. For instance, a plasma induced in the plasma chamber interior 125 using the inductively coupled plasma source 135 can dissociate hydrocarbon molecules and other molecules in the process gas to generate radicals and ions. For instance, the one or more hydrocarbon molecules can be dissociated in the plasma to generate organic radicals, such as $CH_3$ radicals.

At (412), the surface treatment process can include filtering one or more ions generated by the plasma in the mixture to create a filtered mixture. The filtered mixture can include radicals generated by dissociation of the hydrocarbon molecules, such as $CH_3$ radicals.

In some embodiments, the one or more ions can be filtered using a separation grid assembly separating the plasma chamber from a processing chamber where the workpiece is located. For instance, the separation grid 200 can be used to filter ions generated by the plasma. The separation grid 200 can have a plurality of holes. Charged particles (e.g., ions) can recombine on the walls in their path through the plurality of holes. Neutrals (e.g., radicals such as $CH_3$ radicals) can pass through the holes.

In some embodiments, the separation grid 200 can be configured to filter ions with an efficiency greater than or equal to about 90%, such as greater than or equal to about 95%. A percentage efficiency for ion filtering refers to the amount of ions removed from the mixture relative to the total number of ions in the mixture. For instance, an efficiency of about 90% indicates that about 90% of the ions are removed during filtering. An efficiency of about 95% indicates that about 95% of the ions are removed during filtering.

In some embodiments, the separation grid can be a multi-plate separation grid. The multi-plate separation grid can have multiple separation grid plates in parallel. The arrangement and alignment of holes in the grid plate can be selected to provide a desired efficiency for ion filtering, such as greater than or equal to about 95%.

For instance, the separation grid 200 can have a first grid plate 210 and a second grid plate 220 in parallel relationship with one another. The first grid plate 210 can have a first grid pattern having a plurality of holes. The second grid plate 220 can have a second grid pattern having a plurality of holes. The first grid pattern can be the same as or different from the second grid pattern. Charged particles (e.g., ions) can recombine on the walls in their path through the holes of each grid plate 210, 220 in the separation grid 200. Neutral species (e.g., radicals) can flow relatively freely through the holes in the first grid plate 210 and the second grid plate 220.

At (414) of FIG. 6, the surface treatment process can include exposing the workpiece to the filtered mixture. More particularly, the workpiece can be exposed to radicals (e.g., $CH_3$ radicals) generated in the plasma and passing through the separation grid assembly. As an example, organic radicals (e.g., $CH_3$ radicals) can pass through the separation grid 200 and be exposed on the workpiece 114.

The organic radical based surface treatment process can be implemented using other approaches without deviating from the scope of the present disclosure. For instance, in some embodiments, the organic radicals can be generated at least in part using post plasma gas injection.

Figure 7:
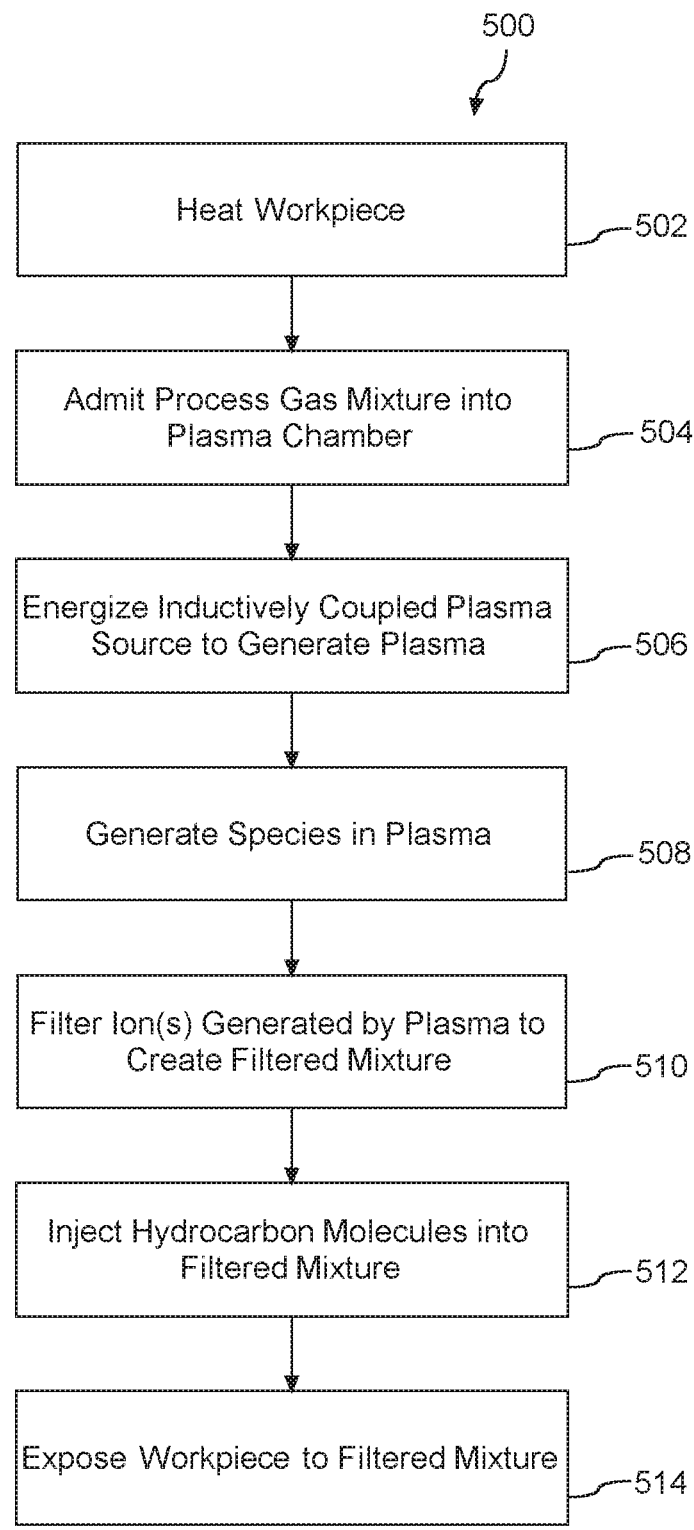
FIG. 7 depicts a flow diagram of an example surface treatment process according to example embodiments of the present disclosure.

For example, FIG. 7 depicts a flow diagram of an example surface treatment process (500) where organic radicals are generated using post plasma gas injection according to example embodiments of the present disclosure. The process (500) will be discussed with reference to the plasma processing apparatus 100 of FIG. 2 by way of example. FIG. 7 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various steps (not illustrated) can be performed without deviating from the scope of the present disclosure.

At (502), the surface treatment process can include heating a workpiece. For instance, the workpiece 114 can be heated in the processing chamber 110 to a process temperature. The workpiece 114 can be heated, for instance, using one or more heating systems associated with the pedestal 112. In some embodiments, the workpiece can be heated to a temperature in the range of about 50° C. to about 400° C.

At (504), the surface treatment process can include admitting a process gas mixture into a plasma chamber. For instance, a process gas can be admitted into the plasma chamber interior 125 from the gas source 150 via the annular gas distribution channel 151 or other suitable gas introduction mechanism. In some embodiment, the process gas can include a reactive gas, such as hydrogen gas ($H_2$). The process gas can include a carrier gas such as $N_2$ and/or He and/or Ar. For example, in some embodiments, the process gas can be a mixture including $H_2$ and $N_2$. In some other embodiments, the process gas can be a mixture including $H_2$ and He. In yet some other embodiments, the process gas can be a mixture including $H_2$ and Ar.

In some embodiments, the process gas can be an inert gas. For instance, the process gas can be an inert gas with no reactive gas. In particular embodiments, the process gas can be helium, argon, xenon or other inert gas.

At (506), the surface treatment process can include energizing an inductively coupled plasma source to generate a plasma in the plasma chamber. For instance, the induction coil 130 can be energized with RF energy from the RF power generator 134 to generate a plasma in the plasma chamber interior 125. In some embodiments, the inductively coupled power source can be energized with pulsed power to obtain desired species with reduced plasma energy.

At (508), the surface treatment process can include generating one or more species in the plasma from the process gas. For instance, a plasma induced in the plasma chamber interior 125 from a reactive process gas (e.g., $H_2$) using the inductively coupled plasma source 135 can dissociate molecules in the process gas mixture to generate radicals (e.g. H radicals) and ions. As another example, a plasma induced in the plasma chamber interior 125 from an inert process gas (e.g., He) using the inductively coupled plasma source 135 can generate one or more excited inert gas molecules (e.g., excited He molecules).

At (510), the surface treatment process can include filtering one or more ions generated by the plasma in the mixture to create a filtered mixture. The filtered mixture can include species generated in the plasma from the process gas.

In some embodiments, the one or more ions can be filtered using a separation grid assembly separating the plasma chamber from a processing chamber where the workpiece is located. For instance, the separation grid 200 can be used to filter ions generated by the plasma.

The separation grid 200 can have a plurality of holes. Charged particles (e.g., ions) can recombine on the walls in their path through the plurality of holes. Neutral particles (e.g., radicals) can pass through the holes. In some embodiments, the separation grid 200 can be configured to filter ions with an efficiency greater than or equal to about 90%, such as greater than or equal to about 95%.

In some embodiments, the separation grid can be a multi-plate separation grid. The multi-plate separation grid can have multiple separation grid plates in parallel. The arrangement and alignment of holes in the grid plate can be selected to provide a desired efficiency for ion filtering, such as greater than or equal to about 95%.

At (512), the process can include mixing hydrocarbon molecules into the filtered mixture post filtering (e.g., at or below the separation grid) outside of the plasma chamber and at a downstream flow from the plasma chamber. The hydrocarbon molecules can react with hydrogen radical to generate desired radicals (e.g., $CH_3$ radicals).

Example hydrocarbon molecules can include, for instance, non-cyclic alkanes having a chemical formula of $C_nH_{2n+2}$ where n is greater than or equal to one and less than or equal to 10. For instance, the hydrocarbon molecules can include non-cyclic alkanes, such as methane $CH_4$, ethane $C_2H_6$, propane or iso-propane $C_3H_8$, etc. The hydrocarbon molecule(s) can include cyclic alkanes having a chemical formula of $C_nH_2$, where n is greater than or equal to five and less than or equal to ten. For instance, the hydrocarbon molecule(s) can include cyclic alkanes such as cyclopentane $C_5H_{10}$, cyclohexane $C_6H_{12}$, methyl-cyclohexane, $C_7H_{14}$, dimethyl-cyclohexane $C_8H_{16}$, 1,3,5-trimethyl-cyclohexane $C_8H_{18}$, etc. In some embodiments, the hydrocarbon molecule(s) can include alkenes $C_nH_{2n}$, where n is greater than or equal to one and less than or equal to ten, such as ethylene $C_2H_4$, propene $C_3H_6$, etc.

Figure 8:
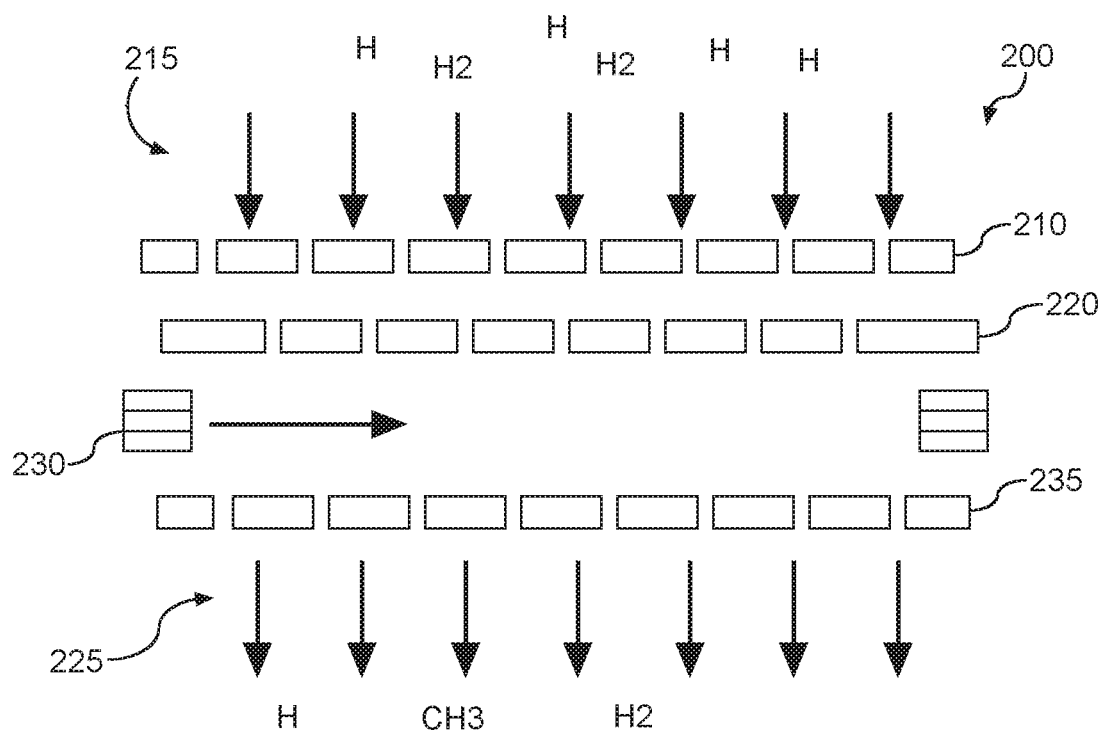
FIG. 8 depicts example post plasma gas injection during a surface treatment process according to example embodiments of the present disclosure.

FIG. 8 depicts an example separation grid 200 for injection of hydrocarbon molecules post ion filtering according to example embodiments of the present disclosure. More particularly, the separation grid 200 includes a first grid plate 210 and a second grid plate 220 disposed in parallel relationship for ion/UV filtering.

The first grid plate 210 and a second grid plate 220 can be in parallel relationship with one another. The first grid plate 210 can have a first grid pattern having a plurality of holes. The second grid plate 220 can have a second grid pattern having a plurality of holes. The first grid pattern can be the same as or different from the second grid pattern. Neutral and charged particles 215 from the plasma can be exposed to the separation grid 200. Charged particles (e.g., ions) can recombine on the walls in their path through the holes of each grid plate 210, 220 in the separation grid 200. Neutral species (e.g., H radicals or excited inert gas molecules) can flow relatively freely through the holes in the first grid plate 210 and the second grid plate 220.

Subsequent to the second grid plate 220, a gas injection source 230 can be configured to admit hydrocarbon gas into the filtered mixture. Radicals (e.g., $CH_3$ radicals) 225 resulting from the injection of hydrocarbon gas can pass through a third grid plate 235 for exposure to the workpiece.

The present example is discussed with reference to a separation grid with three grid plates for example purposes. Those of ordinary skill in the art, using the disclosures provided herein, will understand that more or fewer grid plates can be used without deviating from the scope of the present disclosure.

At (514) of FIG. 7, the surface treatment process can include exposing the workpiece to the filtered mixture. More particularly, the workpiece can be exposed to radicals (e.g., $CH_3$ radicals) after injection of the hydrocarbon molecules. As an example, radicals (e.g., $CH_3$ radicals) can pass through the third grid plate 235 (FIG. 8) and can be exposed on the workpiece 114. In some embodiments, exposing the workpiece to organic radicals can result in methylation of one or more layers on the workpiece.

Figure 9:
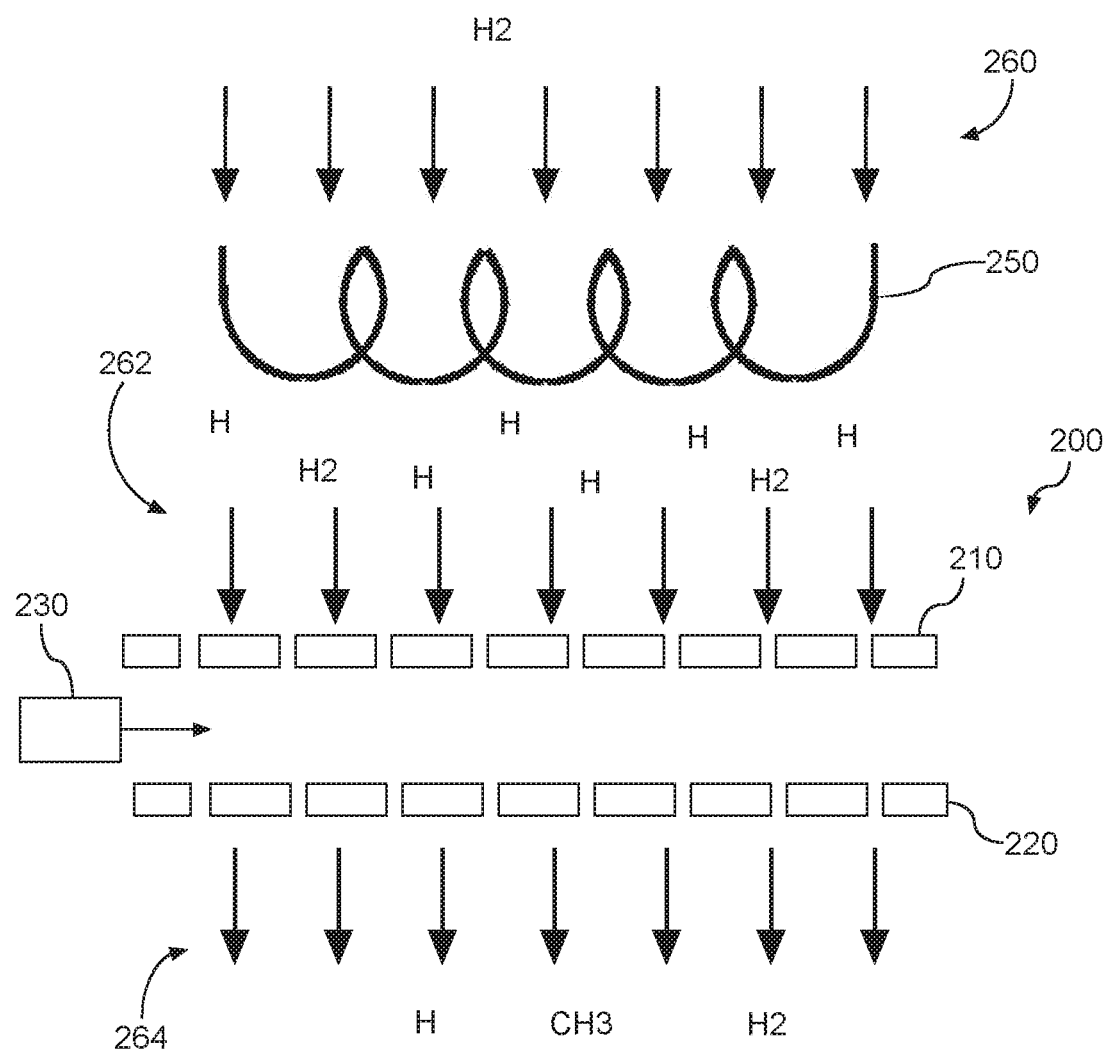
FIG. 9 depicts an example source of hydrogen radicals according to example embodiments of the present disclosure.

In some embodiments, the hydrogen radicals can be generated using a different source of hydrogen radicals. For instance, as shown in FIG. 9, a hydrogen gas $H_2$ can be passed over a heated filament (e.g., a tungsten filament) to generate hydrogen radicals in a first chamber. The hydrogen radicals can be passed through the separation grid 200.

The separation grid 200 includes a first grid plate 210 and a second grid plate 220 disposed in parallel relationship. The first grid plate 210 can have a first grid pattern having a plurality of holes. The second grid plate 220 can have a second grid pattern having a plurality of holes. The first grid pattern can be the same as or different from the second grid pattern.

Subsequent to the first grid plate 210, the gas injection source 230 can be configured to admit hydrocarbon gas into the filtered mixture. Radicals (e.g., $CH_3$) radicals 264 resulting from the injection of hydrocarbon gas can pass through the second grid plate 220 for exposure to the workpiece.

The hydrocarbon gas can include one or more hydrocarbon molecules. Example hydrocarbon molecules can include, for instance, non-cyclic alkanes $C_nH_{2n+2}$ where n is greater than or equal to one and less than or equal to 10. For instance, the hydrocarbon molecules can include non-cyclic alkanes, such as methane $CH_4$, ethane $C_2H_6$, propane or iso-propane $C_3H_8$, etc. The hydrocarbon molecule(s) can include cyclic alkanes $C_nH_{2n}$, where n is greater than or equal to five and less than or equal to ten. For instance, the hydrocarbon molecule(s) can include cyclic alkanes such as cyclopentane $C_5H_{10}$, cyclohexane $C_6H_{12}$, methyl-cyclohexane, $C_7H_4$, dimethyl-cyclohexane $C_8H_{16}$, 1,3,5-trimethyl-cyclohexane $C_9H_{18}$, etc. In some embodiments, the hydrocarbon molecule(s) can include alkenes $C_nH_{2n}$, where n is greater than or equal to one and less than or equal to ten, such as ethylene $C_2H_4$, propene $C_3H_6$, etc.

The present example is discussed with reference to a separation grid with two grid plates for example purposes. Those of ordinary skill in the art, using the disclosures provided herein, will understand that more or fewer grid plates can be used without deviating from the scope of the present disclosure.

The organic radicals (e.g., $CH_3$ radicals) can be generated using other approaches with deviating from the scope of the present disclosure. As one example, organic radicals (e.g., $CH_3$ radicals) can be generated using pyrolysis (thermal decomposition) of molecules (e.g., azomethane $CH_3$—$N$=$N$—$CH_3$). As another example, organic radicals can be generated or UV-assisted molecule dissociation (e.g., acetone $CH_3COCH_3$).

The selective deposition processes according to example aspects of the present disclosure can be implemented in other suitable plasma processing apparatus. For instance, the surface treatment processes according to example embodiments of the present disclosure can be implemented using the example apparatus shown in FIG. 10 and the example apparatus shown in FIG. 11 discussed in detail below.

Figure 10:
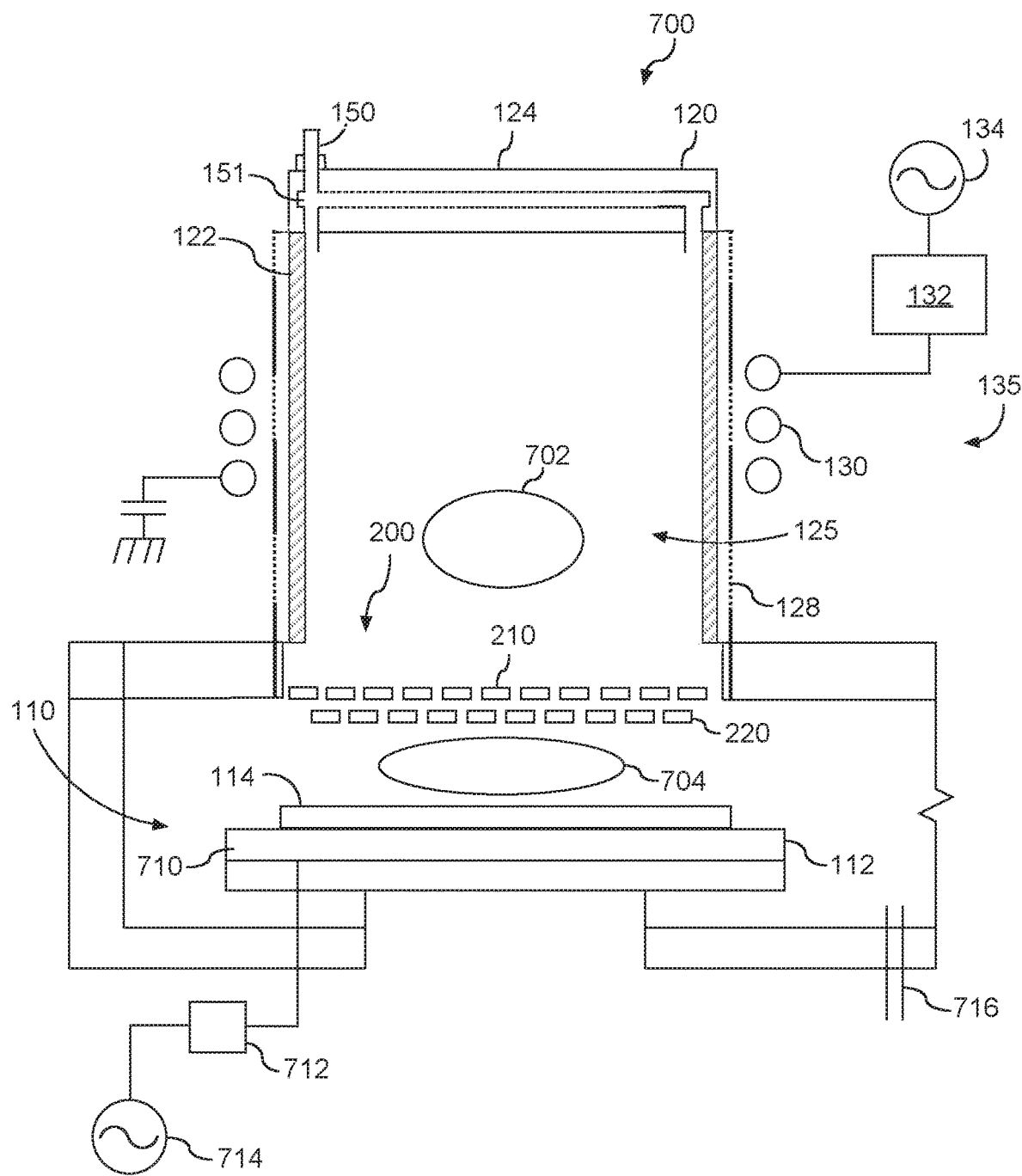
FIG. 10 depicts an example plasma processing apparatus according to example embodiments of the present disclosure.

FIG. 10 depicts an example plasma processing apparatus 700 that can be used to implement processes according to example embodiments of the present disclosure. The plasma processing apparatus 700 is similar to the plasma processing apparatus 100 of FIG. 2.

More particularly, plasma processing apparatus 700 includes a processing chamber 110 and a plasma chamber 120 that is separated from the processing chamber 110. Processing chamber 110 includes a substrate holder or pedestal 112 operable to hold a workpiece 114 to be processed, such as a semiconductor wafer. In this example illustration, a plasma is generated in plasma chamber 120 (i.e., plasma generation region) by an inductively coupled plasma source 135 and desired species are channeled from the plasma chamber 120 to the surface of substrate 114 through a separation grid assembly 200.

The plasma chamber 120 includes a dielectric side wall 122 and a ceiling 124. The dielectric side wall 122, ceiling 124, and separation grid 200 define a plasma chamber interior 125. Dielectric side wall 122 can be formed from a dielectric material, such as quartz and/or alumina. The inductively coupled plasma source 135 can include an induction coil 130 disposed adjacent the dielectric side wall 122 about the plasma chamber 120. The induction coil 130 is coupled to an RF power generator 134 through a suitable matching network 132. Process gases (e.g., an inert gas) can be provided to the chamber interior from gas supply 150 and annular gas distribution channel 151 or other suitable gas introduction mechanism. When the induction coil 130 is energized with RF power from the RF power generator 134, a plasma can be generated in the plasma chamber 120. In a particular embodiment, the plasma processing apparatus 100 can include an optional grounded Faraday shield 128 to reduce capacitive coupling of the induction coil 130 to the plasma.

As shown in FIG. 10, a separation grid 200 separates the plasma chamber 120 from the processing chamber 110. The separation grid 200 can be used to perform ion filtering from a mixture generated by plasma in the plasma chamber 120 to generate a filtered mixture. The filtered mixture can be exposed to the workpiece 114 in the processing chamber.

In some embodiments, the separation grid 200 can be a multi-plate separation grid. For instance, the separation grid 200 can include a first grid plate 210 and a second grid plate 220 that are spaced apart in parallel relationship to one another. The first grid plate 210 and the second grid plate 220 can be separated by a distance.

The first grid plate 210 can have a first grid pattern having a plurality of holes. The second grid plate 220 can have a second grid pattern having a plurality of holes. The first grid pattern can be the same as or different from the second grid pattern. Charged particles can recombine on the walls in their path through the holes of each grid plate 210, 220 in the separation grid. Neutral species (e.g., radicals) can flow relatively freely through the holes in the first grid plate 210 and the second grid plate 220. The size of the holes and thickness of each grid plate 210 and 220 can affect transparency for both charged and neutral particles.

In some embodiments, the first grid plate 210 can be made of metal (e.g., aluminum) or other electrically conductive material and/or the second grid plate 220 can be made from either an electrically conductive material or dielectric material (e.g., quartz, ceramic, etc.). In some embodiments, the first grid plate 210 and/or the second grid plate 220 can be made of other materials, such as silicon or silicon carbide. In the event a grid plate is made of metal or other electrically conductive material, the grid plate can be grounded.

The example plasma processing apparatus 700 of FIG. 10 is operable to generate a first plasma 702 (e.g., a remote plasma) in the plasma chamber 120 and a second plasma 704 (e.g., a direct plasma) in the processing chamber 110. As used herein, a "remote plasma" refers to a plasma generated remotely from a workpiece, such as in a plasma chamber separated from a workpiece by a separation grid. As used herein, a "direct plasma" refers to a plasma that is directly exposed to a workpiece, such as a plasma generated in a processing chamber having a pedestal operable to support the workpiece.

More particularly, the plasma processing apparatus 700 of FIG. 10 includes a bias source having bias electrode 710 in the pedestal 112. The bias electrode 710 can be coupled to an RF power generator 714 via a suitable matching network 712. When the bias electrode 710 is energized with RF energy, a second plasma 704 can be generated from a mixture in the processing chamber 110 for direct exposure to the workpiece 114. The processing chamber 110 can include a gas exhaust port 716 for evacuating a gas from the processing chamber 110. The species used in the oxide removal processes according to example aspects of the present disclosure can be generated using the first plasma 702 and/or the second plasma 704.

Figure 11:
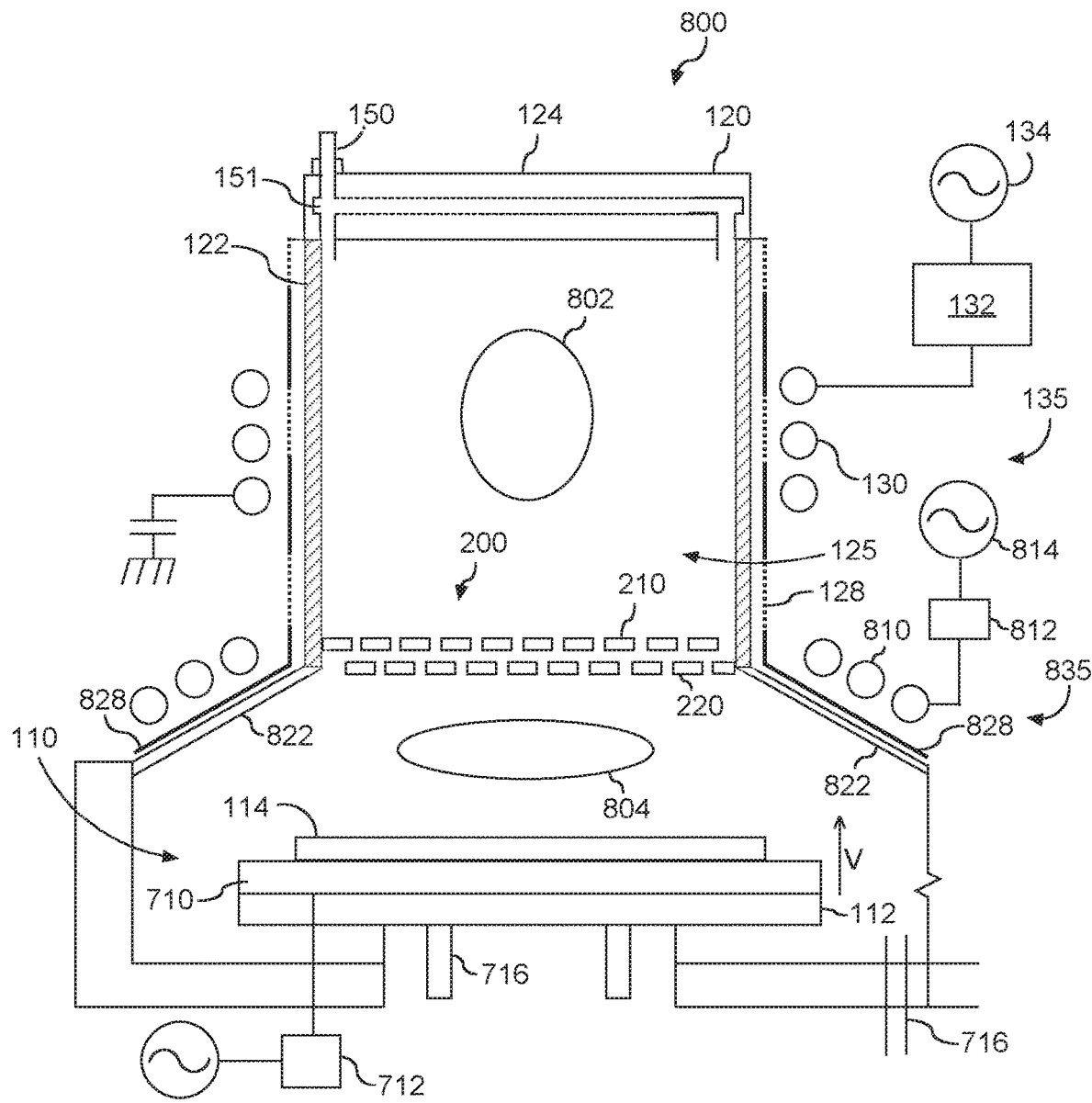
FIG. 11 depicts an example plasma processing apparatus according to example embodiments of the present disclosure.

FIG. 11 depicts a processing chamber 800 similar to that of FIG. 2 and FIG. 10. More particularly, plasma processing apparatus 800 includes a processing chamber 110 and a plasma chamber 120 that is separated from the processing chamber 110. Processing chamber 110 includes a substrate holder or pedestal 112 operable to hold a workpiece 114 to be processed, such as a semiconductor wafer. In this example illustration, a plasma is generated in plasma chamber 120 (i.e., plasma generation region) by an inductively coupled plasma source 135 and desired species are channeled from the plasma chamber 120 to the surface of substrate 114 through a separation grid assembly 200.

The plasma chamber 120 includes a dielectric side wall 122 and a ceiling 124. The dielectric side wall 122, ceiling 124, and separation grid 200 define a plasma chamber interior 125. Dielectric side wall 122 can be formed from a dielectric material, such as quartz and/or alumina. The inductively coupled plasma source 135 can include an induction coil 130 disposed adjacent the dielectric side wall 122 about the plasma chamber 120. The induction coil 130 is coupled to an RF power generator 134 through a suitable matching network 132. Process gas (e.g., an inert gas) can be provided to the chamber interior from gas supply 150 and annular gas distribution channel 151 or other suitable gas introduction mechanism. When the induction coil 130 is energized with RF power from the RF power generator 134, a plasma can be generated in the plasma chamber 120. In a particular embodiment, the plasma processing apparatus 100 can include an optional grounded Faraday shield 128 to reduce capacitive coupling of the induction coil 130 to the plasma.

As shown in FIG. 11, a separation grid 200 separates the plasma chamber 120 from the processing chamber 110. The separation grid 200 can be used to perform ion filtering from a mixture generated by plasma in the plasma chamber 120 to generate a filtered mixture. The filtered mixture can be exposed to the workpiece 114 in the processing chamber.

In some embodiments, the separation grid 200 can be a multi-plate separation grid. For instance, the separation grid 200 can include a first grid plate 210 and a second grid plate 220 that are spaced apart in parallel relationship to one another. The first grid plate 210 and the second grid plate 220 can be separated by a distance.

The first grid plate 210 can have a first grid pattern having a plurality of holes. The second grid plate 220 can have a second grid pattern having a plurality of holes. The first grid pattern can be the same as or different from the second grid pattern. Charged particles can recombine on the walls in their path through the holes of each grid plate 210, 220 in the separation grid. Neutral species (e.g., radicals) can flow relatively freely through the holes in the first grid plate 210 and the second grid plate 220. The size of the holes and thickness of each grid plate 210 and 220 can affect transparency for both charged and neutral particles.

In some embodiments, the first grid plate 210 can be made of metal (e.g., aluminum) or other electrically conductive material and/or the second grid plate 220 can be made from either an electrically conductive material or dielectric material (e.g., quartz, ceramic, etc.). In some embodiments, the first grid plate 210 and/or the second grid plate 220 can be made of other materials, such as silicon or silicon carbide. In the event a grid plate is made of metal or other electrically conductive material, the grid plate can be grounded.

The example plasma processing apparatus 800 of FIG. 11 is operable to generate a first plasma 802 (e.g., a remote plasma) in the plasma chamber 120 and a second plasma 804 (e.g., a direct plasma) in the processing chamber 110. As shown, the plasma processing apparatus 800 can include an angled dielectric sidewall 822 that extends from the vertical sidewall 122 associated with the remote plasma chamber 120. The angled dielectric sidewall 822 can form a part of the processing chamber 110.

A second inductive plasma source 835 can be located proximate the dielectric sidewall 822. The second inductive plasma source 835 can include an induction coil 810 coupled to an RF generator 814 via a suitable matching network 812. The induction coil 810, when energized with RF energy, can induce a direct plasma 804 from a mixture in the processing chamber 110. A Faraday shield 828 can be disposed between the induction coil 810 and the sidewall 822.

The pedestal 112 can be movable in a vertical direction V. For instance, the pedestal 112 can include a vertical lift 816 that can be configured to adjust a distance between the pedestal 112 and the separation grid assembly 200. As one example, the pedestal 112 can be located in a first vertical position for processing using the remote plasma 802. The pedestal 112 can be in a second vertical position for processing using the direct plasma 804. The first vertical position can be closer to the separation grid assembly 200 relative to the second vertical position.

The plasma processing apparatus 800 of FIG. 11 includes a bias source having bias electrode 710 in the pedestal 112. The bias electrode 710 can be coupled to an RF power generator 714 via a suitable matching network 712. The processing chamber 110 can include a gas exhaust port 716 for evacuating a gas from the processing chamber 110.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A method for processing a workpiece, comprising:
   placing the workpiece on a workpiece support in a processing chamber, the workpiece having a first material and a second material, the second material being different than the first material;
   performing an organic radical based surface treatment process on the workpiece to modify an adsorption characteristic of the first material selectively relative to the second material such that the first material has a first adsorption characteristic and the second material has a second adsorption characteristic, the second adsorption characteristic being different from the first adsorption characteristic, the organic radical based surface treatment process comprising:
   generating one or more species in a plasma chamber;
   mixing one or more hydrocarbon molecules with the one or more species to create a mixture, the mixture comprising one or more organic radicals; and
   exposing the first material and the second material on the workpiece to the mixture in the processing chamber; and
   performing a deposition process on the workpiece such that a deposition material is selectively deposited on the second material relative to the first material.

2. The method of claim 1, wherein the organic radical based surface treatment process exposes the workpiece to one or more methyl radicals being the one or more organic radicals.

3. The method of claim 1, wherein the organic radical based surface treatment process results in methylation of the first material.

4. The method of claim 1, wherein the organic radical based surface treatment process comprises:
   generating the one or more species using a plasma induced from a process gas in the plasma chamber;
   filtering the one or more species to generate a filtered mixture;
   mixing the one or more hydrocarbon molecules with the filtered mixture after filtering to create the mixture outside of the plasma chamber and at downstream flow from the plasma chamber, the mixture generated outside of the plasma chamber and at a downstream flow from the plasma chamber comprising the one or more organic radicals; and
   exposing the first material and the second material to the one or more organic radicals.

5. The method of claim 4, wherein the one or more species are generated by the plasma induced in the process gas in the plasma chamber.

6. The method of claim 5, wherein the process gas is an inert gas.

7. The method of claim 6, wherein the inert gas is helium.

8. The method of claim 4, wherein the process gas comprises a hydrogen gas and the one or more species comprise hydrogen radicals.

9. The method of claim 1, wherein performing a deposition process comprises exposing the first material and the second material to a precursor.

10. The method of claim 1, wherein the first material comprises a dielectric material and the second material comprises a metal material.

11. The method of claim 10, wherein the dielectric material is methylated during the organic radical surface treatment process and the metal material is not methylated during the organic radical surface treatment process.

12. The method of claim 11, wherein the deposition material is not deposited on the dielectric material during the deposition process and the deposition material is deposited on the metal material.

13. The method of claim 1, wherein the one or more hydrocarbon molecules have a chemical formula of $C_nH_{2n}$, where n is greater than or equal to 1 and less than or equal to 10.

14. The method of claim 1, wherein the one or more hydrocarbon molecules have a chemical formula of $C_nH_{2n}$, where n is greater than or equal to 2 and n is less than or equal to 10.

15. The method of claim 1, wherein the organic radical based surface treatment process exposes the workpiece to one or more organic radicals, wherein the one or more organic radicals are generated using pyrolysis of molecules or UV-assisted molecule dissociation.

16. The method of claim 1, wherein the method comprises filtering one or more ions being the one or more species using a separation grid separating the plasma chamber from the processing chamber.

17. A method of performing a deposition process for $Al_2O_3$ on a workpiece having a dielectric layer and a copper layer, the method comprising:
   placing the workpiece on a workpiece support in a processing chamber, the workpiece having the dielectric layer and the copper layer;
   performing a methyl radical based surface treatment process on the workpiece to methylate the dielectric layer selectively relative to the copper layer to generate a methylated dielectric layer; and
   performing a deposition process to selectively deposit an $Al_2O_3$ layer on the copper layer selectively relative to the dielectric layer.

18. The method of claim 17, wherein the methyl radical based surface treatment process modifies an adsorption characteristic of the dielectric layer relative to the copper layer.

19. The method of claim 18, wherein the deposition process comprises exposing the workpiece to trimethyl aluminum and $H_2O$ molecules.

* * * * *